United States Patent [19]

Artus et al.

[11] Patent Number: 5,525,644
[45] Date of Patent: Jun. 11, 1996

[54] POTTED ELECTRICAL COMPONENTS AND METHODS OF MAKING THE SAME

[75] Inventors: David E. Artus, Binghamton; Philip J. Morton, Bainbridge, both of N.Y.

[73] Assignee: Simmonds Precision Engine Systems, Akron, Ohio

[21] Appl. No.: 127,098

[22] Filed: Sep. 24, 1993

Related U.S. Application Data

[63] Continuation of Ser. No. 949,308, Sep. 22, 1992, abandoned.

[51] Int. Cl.$^6$ ........................................... C08G 63/44
[52] U.S. Cl. ............... 521/184; 174/52.2; 174/52.3; 174/110 F; 174/110 SR; 264/46.4; 428/36.5; 428/308.4; 428/318.4; 428/319.1; 428/473.5; 521/183; 521/185; 521/187; 521/189; 521/157
[58] Field of Search .................. 521/183, 184, 521/185, 187, 189, 157; 428/36.5, 308.4, 318.4, 319.1, 473.5; 264/46.4; 174/52.2, 52.3, 110 F, 110 SR

[56] References Cited

U.S. PATENT DOCUMENTS

| | | | |
|---|---|---|---|
| 3,607,387 | 9/1971 | Lanza et al. | 428/401 |
| 3,824,328 | 7/1974 | Ting et al. | 174/52 |
| 4,094,862 | 6/1978 | Bell . | |
| 4,183,839 | 1/1980 | Gagliani | 528/125 |
| 4,305,796 | 12/1981 | Gagliani et al. | 521/185 |
| 4,369,261 | 1/1983 | Gagliani et al. | 521/189 |
| 4,439,381 | 3/1984 | Gagliani et al. | 521/185 |
| 4,440,883 | 4/1984 | Pammer | 523/402 |
| 4,525,507 | 6/1985 | Chaker et al. | 524/104 |
| 4,532,263 | 7/1985 | Krutchen et al. | 521/133 |
| 4,677,528 | 6/1987 | Miniet et al. | 361/398 |
| 4,725,693 | 2/1988 | Hirsch | 428/381 |
| 4,822,870 | 4/1989 | Restaino | 528/322 |
| 4,898,763 | 2/1990 | Ferro | 428/159 |
| 4,933,375 | 6/1990 | Shulman | 521/117 |
| 4,992,059 | 2/1991 | King et al. | 439/85 |
| 4,999,419 | 3/1991 | Restaino | 528/322 |
| 5,077,318 | 12/1991 | Barringer et al. | 521/88 |
| 5,096,932 | 3/1992 | Barringer et al. | 521/117 |
| 5,153,234 | 10/1992 | Loy et al. | 521/157 |
| 5,248,519 | 9/1993 | Stoakley et al. | 427/96 |

FOREIGN PATENT DOCUMENTS

| | | |
|---|---|---|
| 62-069650 | 3/1987 | Japan . |
| 62-123724 | 6/1987 | Japan . |
| 1238150 | 9/1989 | Japan . |
| 2137248 | 5/1990 | Japan . |

OTHER PUBLICATIONS

JP-A-62 123 724, Hitachi Ltd., Semiconductor Device Provided With Comparatively Thick Synthetic Resin Protective Coat, Jun. 5, 1987.
EP-A-0 373 402, General Electric Company, Expandable Polyetherimide Resins, Jun. 20, 1990.
EP 93 30 7212, European Search Report mailed May 24, 1994.
JP-A-62 069 650, Hitachi Ltd., Semiconductor Device, Mar. 30, 1987.
JP-A-02 137 248, Nec Corp., Resin-Sealed Semiconductor Device, May 25, 1990.
JP-A-01 238 150, Fujitsu Ltd., Semiconductor Device, Sep. 22, 1989.

*Primary Examiner*—James J. Seidleck
*Assistant Examiner*—John M. Cooney, Jr.
*Attorney, Agent, or Firm*—William C. Tritt; William E. Zitelli

[57] ABSTRACT

This invention relates to an article comprising a potted electrical component in a structure, wherein the electrical component is potted in a polyimide composition. The invention also relates to a method of potting electrical components comprising the steps of (1) adding a polyimide precursor to a structure including an electrical component, (2) curing the polyimide precursor to form a polyimide composition encapsulating the electrical component.

22 Claims, 1 Drawing Sheet

POTTED ELECTRICAL COMPONENTS AND METHODS OF MAKING THE SAME

This is a file wrapper continuation of application Ser. No. 07/949,308, filed Sep. 22, 1992, now abandoned.

FIELD OF THE INVENTION

This invention relates to potted electrical components in the structure and methods for making the same.

BACKGROUND OF THE INVENTION

Electrical components and structures generally require supporting, or potting, material. The potting material must have sufficient mechanical strength to provide support to the electronic components within the structure. When the electronic components are used in hydraulic and aircraft systems, the potting material comes into contact with aircraft fluids, such as hydraulic fluids and jet fuel. The potting material must be chemically inactive to these fluids. Further, in aircraft applications, the potting material must be thermally and mechanically stable. Often, the potting materials are exposed to temperatures up to about 315° C.

Presently, fluorosilicone is added to cable assemblies to provide support for wires. This material has deficiencies because of its weight. The fluorosilicone potting material also swells when heated, and when exposed to hydraulic fluids and jet fuels. It is desirous to provide an inexpensive, light weight, mechanically strong material which is not affected by hydraulic fluids and jet fuels.

SUMMARY OF THE INVENTION

This invention relates to an article comprising a potted electrical component in a structure, wherein the electrical component is potted in a polyimide composition. The invention also relates to a method of potting electrical components comprising the steps of (1) adding a polyimide precursor to a structure including an electrical component, and (2) curing the polyimide precursor to form a polyimide composition encapsulating the electrical component.

DESCRIPTION OF THE PREFERRED EMBODIMENTS

Figure 1:
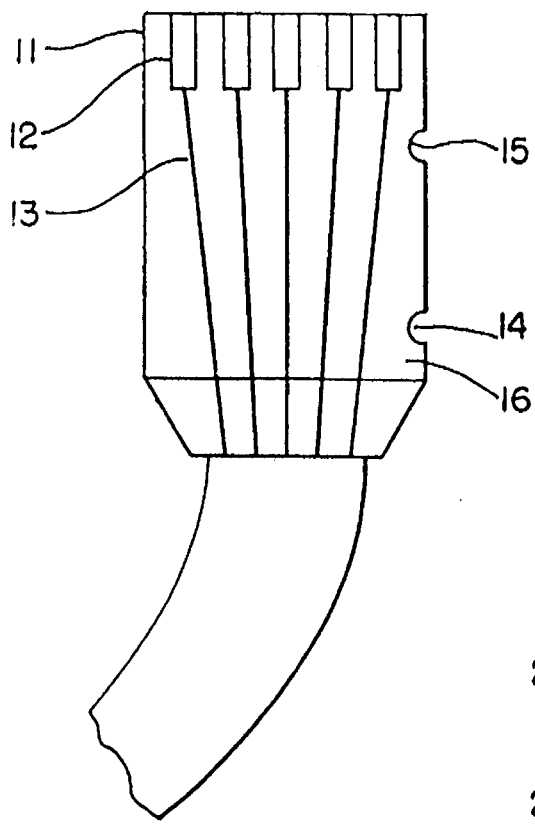
FIG. 1 refers to a cross section of a electrical connector assembly.

As described herein, the present invention relates to potting electrical components with a polyimide. The electronic components include wires, pins, resistors, transistors, capacitors, circuit boards, diodes, etc. The electronic components also include subassemblies which are combinations of the above electronic components.

The potted electrical components are typically disposed within the structure. The structures include connector backshells, electronic housings, and alternator housings. Electronic housings include exciter boxes, power conditioning units, transformers, etc. The electrical components are encapsulated by the potting material in the structures. The electrical components are placed within the structures by means known to those in the art. In one embodiment, the electrical structure is a connector backshell and the electrical components are wires and pins.

As described above, the potting material is a polyimide composition. In one embodiment the polyimide composition is a polyimide foam. The polyimide foam is characterized as having many small voids. The foam is a partially closed cell polyimide foam. The polyimide foam has a density, under unrestrained foaming, from about 10, or about 15, or about 20 up to about 35, or to about 30 Kg/m$^3$. A particularly useful polyimide foam has a density (unrestrained foaming) of about 24 Kg/m$^3$. In one embodiment, the polyimide composition has an insulation resistance of at least about 1, or about 3, or about 4 gigohms. In another embodiment, the polyimide composition has a AC leakage of less than about 400, or about 300, or about 100 micro-amperes.

A Polyimide composition is prepared generally by reacting aromatic tetracarboxylic acids, tetracarboxylic esters, or dianhydrides with aromatic diamines. Preferred among the tetracarboxylic acid esters are the alkyl esters of 3,3',4,4'-benzophenone tetracarboxylic acid, most preferably the lower ($C_1$ to $C_6$ linear or branched chain) alkyl, e.g., methyl or ethyl, diesters thereof. Mixtures of two or more aromatic tetracarboxylic acid esters, most preferably predominating in diesters, may be employed, if desired. Preferably, the polyimide is formed from 3,3',4,4'-benzophenone-tetracarboxylic dimethyl ester.

It is also possible, in accordance with this invention, that the tetracarboxylic component employed in the manufacture of the polyimide compositions be a caprolactam derivative as disclosed in U.S. Pat. Nos. 4,161,477, 4,183,838 and 4,183,839, the disclosures of which are incorporated herein by reference.

The tetracarboxylic component may also be an N-substituted imido acid ester of the tetracarboxylic acid as disclosed in U.S. Pat Nos. 4,647,597 and 4,656,198, the disclosures of which are incorporated-herein by reference.

The polyimide is also prepared from aromatic diamines. The aromatic diamines include: 2,6-diaminopyridine, 3,5-diaminopyridine, 3,3'-diaminodiphenyl sulfone, 4,4'-diaminodiphenyl sulfone, 4,4'-diaminodiphenyl sulfide, 3,3'-diaminodiphenyl ether, 4,4'-diaminodiphenyl ether, meta-phenylene diamine, para-phenylene diamine, p,p'-methylene dianiline, 2,6-diamino toluene, and 2,4-diamino toluene. A preferred diamine is methylene dianiline. Although the polyimide is prepared from aromatic diamines, other polyamines may be included in mixture with aromatic diamines.

As described above, polyimide is prepared from polyimide precursors. The polyimide precursors include monomeric mixtures of aromatic dianhydrides, tetracarboxylic acids, or tetracarboxylic esters, and aromatic diamines, as well as polymeric polyimide precursors such as polyamide-acid resins. The aromatic dianhydride, tetracarboxylic acid, or tetracarboxylic ester, as well as the aromatic diamine have been described above. The monomers are polymerized (cured) to form the polyimide. Procedures for preparing polyimides as well as polyimides are described in U.S. Pat. Nos. 4,369,261, 4,822,870, 4,999,416, 5,077,318 and 5,096,932. These references are hereby incorporated by reference for their descriptions of polyimides and methods of making the same.

In one embodiment the polyimide precursor is a polyamide-acid resin. The polyamide-acid resin may be prepared by a ring opening reaction product of a diaromatic carboxylic anhydride and a diaromatic amine. The diamine reacts with the carboxylic anhydride to form amide and acids groups on the polymer. The polyamide-acid resin may be cured upon heating to form polyimides with resultant loss of water.

A particularly useful polyimide precursor is Dexter Polyimide Resin X-2352 available from Dexter Chemical Company. This material is a polyimide precursor solution of a resin derived from 4,4'-methylene dianiline and 3,3',4,4'-benzophenone-tetracarboxylic dimethyl ester. The solution contains 30–70 percent by weight methanol.

As described above, the present invention includes a method of potting electrical components. The method includes the steps of (1) adding a polyimide precursor to a structure containing an electrical component, and (2) curing the polyimide precursor to form polyimide composition encapsulating the electrical component. The polyimide precursor may be added as a monomeric mixture, or resin, such as a polyamide-acid resin, as described above. The polyamide precursor is generally added at ambient temperature to the structure. The polyimide precursor may be injected into the structure to fill a portion of the cavity in the structure. The structure and polyamide precursors are then heated to a temperature sufficient to cure the polyimide precursor. Typically from about 0.05, or about 0.1, or about 0.2 up to about 1, or about 0.75, or to about 0.5 grams of polyimide precursor is used for each cubic centimeter of the structure. Generally, the temperature for curing polyimide precursors is from about 175° C., or about 200° C., up to about 250° C., or to about 225° C.

In one embodiment, the binding composition may also include a solvent, such as an alcohol. Generally, the alcohol contains from 1 to about 12 carbon atoms, preferably from 1 to about 3 carbon atoms. In one embodiment, the polyimide precursor is added as a methanol solution. The alcohol also contributes to the production of polyimide composition.

The invention is further exemplified with reference to the drawings. In FIG. 1, the electrical connector has connector backshell 11 containing wires 12 and pins 13 as well as filler/vent holes 14 and 15. Polyimide precursor is added through filler/vent hole 15 or 14 to partially fill cavity 16 in connector backshell 11. The filling may be accomplished by pouring or injecting the polyimide precursor into the connector backshell. The connector is then placed in an oven at 175° C. for 1 hour. Water and solvent produced by curing are vented through holes 14 and 15. In one embodiment, one of holes 14 or 15 is covered. The vent hole can be covered by fiberglass tape. After curing of the polyimide resin, the connector backshell cavity 16 is filled with polyimide composition. The foam has dispersed small voids. Generally, the foam is characterized as having many small voids.

Figure 2:
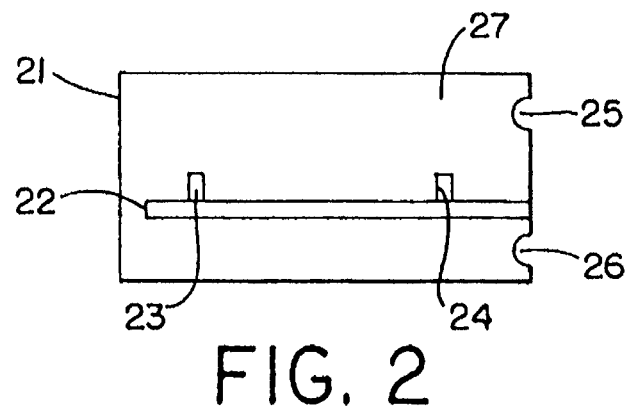
FIG. 2 is a cross section of an electronic housing containing a subassembly.

With reference to FIG. 2, an electronic structure has electronic housing 21 containing subassembly 22 having resistor 23 and circuit card 24 as well as filler/vent holes 25 and 26. Polyimide precursor is added by syringe injection to cavity 27 through hole 25 and 26. The electronic housing is placed in an oven at 175° C. for 1 hour. The polyimide formed fills cavity 27. The foam provides support to the subassembly.

The following examples relate to the articles, and methods of the present invention. In the following examples as well as in the specification and claims, parts and percentages are by weight, temperature is degrees Celsius, and pressure is atmospheric.

EXAMPLE 1

Dexter polyimide resin X-2352 (4.6 grams) is added to a cylindrical connector assembly through one of two holes in the connector backshell. The polyimide resin contains 70% by weight methanol. The connector assembly includes a connector backshell with an internal volume of 57.4 cm$^3$, wires, and pins. The connector assembly is placed in a 230° C. oven for 40 minutes. The polyimide resin forms a polyimide foam which filled the connector backshell and encapsulates the wires and pins.

EXAMPLE 2

Following the same procedure of Example 1, 0.7 grams of the polyimide resin of Example 1 is added to a right angle connector assembly with wires, pins, and a backshell having a internal volume of 7.2 cm$^3$. One of the holes in the connector backshell is covered with fiberglass tape and connector assembly is placed in a 230° C. oven for 40 minutes. The polyimide resin forms a polyimide foam in the connector assembly which encapsulates the wires and pins.

EXAMPLE 3

Following the procedure of Example 1, 9.7 grams of polyimide resin of Example 1 is added to a pigtail connector assembly having wires, pins, and a backshell with an internal volume of 55 cm$^3$. The connector assembly is placed in an oven at 230° C. for 40 minutes. The polyimide resin forms a foam filling the connector backshell. The weight of the pigtail connector assembly before addition of polyimide resin is 764 grams. The weight of the filled assembly is 773.7 grams. After curing the polyimide resin and removing the foam out, the assembly weighs 766.2 grams.

To test the durability of the pigtail connector assembly of Example 3, the assembly is placed in a vibrational tester at room temperature. The pigtail assembly is exposed to a maximum vibrational force of 20 G (gravitational constant) at 2000 Hz along all three axes for a total time of 45 minutes. The pigtail assembly shows no evidence of deterioration.

To test the electrical properties of the pigtail assembly, the assembly is submerged for 10 minutes into a composition comprising one part each of JP4 jet fuel, JP5 jet fuel, 1010 oil (MIL-L-6081), MIL-H-7808 oil, and a MIL-H-5606 hydraulic fluid. The pigtail assembly is removed from the composition and allowed to drip dry for a minimum of one hour. The assembly is then placed in a 32° C. oven for six hours. The cycle of submersions and heating is repeated four times.

The insulation of the pigtail assembly is measured before and after treatment with the above composition. The insulation resistance is measured by connecting all contacts in the assembly except one. A 500 VDC (volt direct current) is applied between the contact and the other circuit connected contacts and backshell for one second. To have useful insulating properties a connector should have an insulation resistance of ten megohms minimum.

To test the AC leakage of the pigtail assembly, all contacts in the assembly are connected to the connector backshell except one. A voltage (500 volts RMS at 60 Hz) is applied within ten seconds. The AC leakage is measured on a megohmeter. A connector should have an AC leakage of less than 500 micro-amperes.

Table 1 contains insulation resistance and AC leakage data for the pigtail assembly of Example 3. The insulation resistance and the AC leakage of the assembly is measured before and after treatment with the above described jet fuel, oil, and hydraulic fluid composition.

TABLE 1

| Connector Pin | IR Before Treatment (Gigohms) | IR After Treatment (Gigohms) | AC Leakage Before Treatment (micro-amperes) | AC Leakage After Treatment (micro-amperes) |
| --- | --- | --- | --- | --- |
| A | 5.6 | 6.0 | 40 | 40 |
| B | 5.8 | 8.3 | 40 | 40 |
| C | 5.9 | 8.4 | 40 | 40 |
| D | 5.5 | 7.4 | 40 | 40 |
| E | 5.9 | 6.3 | 40 | 40 |
| F | 5.4 | 8.2 | 40 | 40 |
| G | 5.1 | 6.9 | 40 | 40 |
| H | 5.6 | 6.8 | 40 | 40 |
| I | 6.7 | 7.6 | 40 | 40 |
| J | 6.1 | 7.3 | 40 | 40 |
| K | 6.1 | 8.0 | 40 | 40 |
| L | 5.6 | 8.1 | 40 | 40 |
| M | 5.7 | 8.0 | 40 | 40 |
| N | 5.9 | 8.1 | 40 | 40 |
| O | 5.8 | 7.5 | 40 | 40 |
| P | 7.0 | 6.6 | 40 | 40 |
| Q | 5.8 | 8.4 | 40 | 40 |
| R | 4.8 | 9.0 | 40 | 40 |
| S | 6.6 | 7.8 | 40 | 40 |
| T | 5.9 | 6.3 | 40 | 40 |
| U | 8.6 | 8.1 | 40 | 40 |

As can be seen from the above data, connector assemblies which use polyimide compositions as potting material have excellent insulation resistance and AC leakage properties, even after exposure to jet fuel, jet oils, and hydraulic fluids.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as well as fall within the scope of the appendant claim.

We claim:

1. An article comprising a potted electrical component in a structure selected from the group consisting of a backshell and a housing, wherein the electrical component is potted in a polyimide foam wherein the foam has a density, under unrestrained foaming, from about 10 up to about 35 Kg/m$^3$, an insulation resistance of at least about 1 gigohms, and a AC leakage of less than about 400 micro-amperes.

2. The article of claim 1 wherein the structure is selected from the group consisting of a connector backshell, an electronic housing, and an alternator housing.

3. The article of claim 1 wherein the electrical component is selected from the group consisting of a wire, a pin, a capacitor, a circuit card, a resistor, and a diode.

4. The article of claim 1 wherein the structure comprises a connector backshell, and the electrical component comprises wires and pins.

5. The article of claim 1 wherein the structure comprises an electronic housing selected from the group consisting of a transformer, an exciter box, and a power conditioning unit.

6. The article of claim 1 wherein the polyimide composition has a insulation resistance of at least about 100 gigohms.

7. The article of claim 1 wherein the polyimide composition is prepared by curing a polyimide precursor.

8. The article of claim 1 wherein the polyimide composition is prepared by curing a polyimide precursor of 4,4'-methylene dianiline and 3,3',4,4'-benzophenonetetracarboxylic dimethyl ester.

9. A method of potting electrical components comprising the steps of (1) adding a polyimide precursor to a structure selected from the group consisting of a backshell and a housing including an electrical component, (2) curing the polyimide precursor to form a polyimide foam encapsulating the electrical component wherein the foam has a density, under unrestrained foaming, from about 10 up to about 35 Kg/m$^3$, an insulation resistance of at least about 1 gigohms, and a AC leakage of less than about 400 micro-amperes.

10. The method of claim 9 wherein the structure is selected from the group consisting of a connector backshell, an electronic housing, and an alternator housing.

11. The method of claim 9 wherein the electrical component is selected from the group consisting of a wire, a pin, a capacitor, a circuit card, a resistor, and a diode.

12. The method of claim 9 wherein the polyimide precursor is added as an alcohol solution.

13. The method of claim 9 wherein the curing occurs at a temperature from about 175° C. to about 250° C.

14. A combination comprising an electrical component encapsulated in a polyimide potting foam wherein the foam has a density, under unrestrained foaming, from about 10 up to about 35 Kg/m$^3$, an insulation resistance of at least about 1 gigohms, and a AC leakage of less than about 400 micro-amperes.

15. The combination of claim 14 wherein the electrical component is selected from the group consisting of a wire, a pin, a capacitor, a circuit card, a resistor, and a diode.

16. The article of claim 14 wherein the polyimide composition has a insulation resistance of at least about 100 gigohms.

17. The combination of claim 14 wherein the polyimide potting is prepared by curing a polyimide precursor.

18. The combination of claim 14 wherein the polyimide potting material is prepared by curing an alcohol solution of a polyimide precursor.

19. The combination of claim 14 wherein the curing occurs at a temperature from about 175° C. to about 250° C.

20. The combination of claim 14 wherein the structure is selected from the group consisting of a connector backshell, an electronic housing, and alternator housing.

21. A method of supporting electrical components comprising the steps of (1) disposing the electrical components in a structure selected from the group consisting of a backshell and a housing, and (2) adding a curable composition of a polyimide precursor to the structure, and (3) curing the composition to form a polyimide foam wherein the foam has a density, under unrestrained foaming, from about 10 up to about 35 Kg/m$^3$, an insulation resistance of at least about 1 gigohms, an a AC leakage of less than about 400 micro-amperes.

22. An article comprising a potted electrical component in a structure, wherein the electrical component is potted in a polyimide foam wherein the foam has a density, under unrestrained foaming, from about 10 up to about 35 Kg/m$^3$, an insulation resistance of at least about 1 gigohms, and a AC leakage of less than about 400 micro-amperes.

* * * * *